United States Patent
Kitai et al.

(10) Patent No.: US 10,870,721 B2
(45) Date of Patent: Dec. 22, 2020

(54) POLYPHENYLENE ETHER RESIN COMPOSITION, PREPREG, METAL-CLAD LAMINATE AND PRINTED WIRING BOARD

(71) Applicant: PANASONIC INTELLECTUAL PROPERTY MANAGEMENT CO., LTD., Osaka (JP)

(72) Inventors: Yuki Kitai, Osaka (JP); Hiroaki Fujiwara, Nara (JP); Hirosuke Saito, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/448,191

(22) Filed: Jun. 21, 2019

(65) Prior Publication Data

US 2019/0300639 A1 Oct. 3, 2019

Related U.S. Application Data

(63) Continuation of application No. 14/898,857, filed as application No. PCT/JP2014/003177 on Jun. 13, 2014, now Pat. No. 10,590,223.

(30) Foreign Application Priority Data

Jun. 18, 2013 (JP) .................................. 2013-127464

(51) Int. Cl.
| | |
|---|---|
| C08F 290/06 | (2006.01) |
| C08J 5/24 | (2006.01) |
| B32B 15/14 | (2006.01) |
| C08F 279/02 | (2006.01) |
| C08G 65/48 | (2006.01) |
| C08K 5/01 | (2006.01) |
| C08L 9/00 | (2006.01) |
| C08L 71/12 | (2006.01) |
| H05K 1/03 | (2006.01) |
| B32B 5/02 | (2006.01) |
| C08K 5/03 | (2006.01) |
| C08L 51/08 | (2006.01) |

(52) U.S. Cl.
CPC .......... *C08F 290/062* (2013.01); *B32B 5/022* (2013.01); *B32B 15/14* (2013.01); *C08F 279/02* (2013.01); *C08G 65/485* (2013.01); *C08J 5/24* (2013.01); *C08K 5/01* (2013.01); *C08K 5/03* (2013.01); *C08L 9/00* (2013.01); *C08L 51/08* (2013.01); *C08L 71/126* (2013.01); *H05K 1/0306* (2013.01); *H05K 1/0373* (2013.01); *B32B 2260/021* (2013.01); *B32B 2260/046* (2013.01); *B32B 2262/101* (2013.01); *B32B 2307/204* (2013.01); *B32B 2307/306* (2013.01); *B32B 2457/08* (2013.01); *C08J 2351/08* (2013.01); *C08J 2371/12* (2013.01); *C08L 2203/20* (2013.01); *H05K 1/0326* (2013.01); *H05K 1/0366* (2013.01); *H05K 2201/012* (2013.01)

(58) Field of Classification Search
CPC ..... C08L 2203/20; C08L 9/00; C08G 65/485; C08J 5/24; B32B 2457/08; H05K 1/0366; H05K 1/0326; H05K 1/0306; H05K 1/0373; H05K 2201/012; C08F 290/062
See application file for complete search history.

(56) References Cited

U.S. PATENT DOCUMENTS

| | | | | |
|---|---|---|---|---|
| 4,923,932 | A | | 5/1990 | Katayose et al. |
| 5,162,435 | A | * | 11/1992 | Shibuya ................. C08L 23/02 |
| | | | | 525/152 |
| 5,310,792 | A | * | 5/1994 | Inoue ..................... C08F 291/00 |
| | | | | 525/123 |
| 5,310,820 | A | | 5/1994 | Nelissen |
| 5,559,185 | A | * | 9/1996 | Abe ......................... C08L 51/04 |
| | | | | 525/132 |
| 6,100,339 | A | * | 8/2000 | Watanabe ............... C08F 232/00 |
| | | | | 524/554 |
| 6,306,963 | B1 | * | 10/2001 | Lane .................... C08F 290/061 |
| | | | | 525/242 |

(Continued)

FOREIGN PATENT DOCUMENTS

| | | |
|---|---|---|
| JP | 55-040615 | 10/1980 |
| JP | 55-040616 | 10/1980 |

(Continued)

OTHER PUBLICATIONS

ISR issued in International App. No. PCT/JP2014/003177, dated Aug. 19, 2014.

(Continued)

*Primary Examiner* — Timothy J Thompson
*Assistant Examiner* — Rhadames Alonzo Miller
(74) *Attorney, Agent, or Firm* — Greenblum & Bernstein, P.L.C.

(57) ABSTRACT

A polyphenylene ether resin composition includes (A) a modified polyphenylene ether that is end-modified with a substituent having a carbon-carbon unsaturated double bond, and (B) a crosslinking agent having a carbon-carbon unsaturated double bond. The crosslinking agent serving as component (B) includes from 50 to 100 mass % of (B-1) divinylbenzene and (B-2) polybutadiene. Components (A) and (B) are included in a ratio therebetween, expressed as the mass ratio (A):(B), of from 65:35 to 95:5. Components (B-1) and (B-2) are included in a ratio therebetween, expressed as the mass ratio (B-1):(B-2), of from 1:100 to 1.5:1.

14 Claims, No Drawings

(56) References Cited

U.S. PATENT DOCUMENTS

| | | | | |
|---|---|---|---|---|
| 2004/0146692 A1* | 7/2004 | Inoue | ............ | B32B 15/14 |
| | | | | 428/141 |
| 2008/0071014 A1* | 3/2008 | Ohishi | ............ | C08K 5/18 |
| | | | | 524/258 |
| 2008/0254257 A1 | 10/2008 | Inoue et al. | | |
| 2010/0016509 A1* | 1/2010 | Fujita | ............ | C08F 8/00 |
| | | | | 525/207 |
| 2011/0088933 A1* | 4/2011 | Amou | ............ | H05K 3/385 |
| | | | | 174/257 |
| 2011/0214906 A1 | 9/2011 | Baars et al. | | |

FOREIGN PATENT DOCUMENTS

| | | | |
|---|---|---|---|
| JP | 64-069629 | | 3/1989 |
| JP | 04-088053 | | 3/1992 |
| JP | 04088053 | A * | 3/1992 |
| JP | 2004-511580 | | 4/2004 |
| JP | 2005-060635 | | 3/2005 |
| JP | 2006-516297 | | 6/2006 |
| JP | 2009-078209 | | 4/2009 |
| JP | 2010-111758 | | 5/2010 |

OTHER PUBLICATIONS

IPRP issued in International App. No. PCT/JP2014/003177, dated Dec. 22, 2015.

* cited by examiner

POLYPHENYLENE ETHER RESIN COMPOSITION, PREPREG, METAL-CLAD LAMINATE AND PRINTED WIRING BOARD

CROSS-REFERENCE TO RELATED APPLICATIONS

This application is a Continuation of U.S. patent application Ser. No. 14/898,857, filed on Dec. 16, 2015, which is a National Stage application of PCT/IP2014/003177 filed on Jun. 13, 2014, which claims the benefit of Japanese Application No. 2013-127464, filed on Jun. 18, 2013, the entire disclosures of which are incorporated by reference herein.

TECHNICAL FIELD

This invention relates to a polyphenylene ether resin composition, a prepreg, a metal-clad laminate and a printed wiring board.

BACKGROUND ART

Polyphenylene ethers (PPE) are known to be endowed with excellent dielectric properties such as dielectric constant and loss tangent, and to have excellent dielectric properties even in the MHz to GHz high-frequency bands (high-frequency regions). Hence, polyphenylene ethers are being investigated for use as, for example, molding materials for high-frequency applications. Specifically, their suitability for use as, e.g., substrate materials for printed wiring boards to be provided in electronic equipment that utilizes high-frequency bands, is under investigation.

At the same time, when used as molding materials for substrate materials and the like, in addition to having excellent dielectric properties, polyphenylene ethers are also required to have excellent heat resistance, moldability and other properties. However, because polyphenylen ethers are thermoplastic, they have sometimes lacked the ability to achieve a sufficient heat resistance. It is thus conceivable, for example, to use a polyphenylene ether to which a thermoset resin such as an epoxy resin has been added, or to use a modified polyphenylene ether.

Accordingly, the applicant has proposed, as a modified polyphenylene ether-containing resin composition, the modified polyphenylene ether compound-containing resin composition described in Patent Literature 1.

Patent Literature 1 describes a polyphenylene ether resin composition which includes a polyphenylene ether having a polyphenylene ether moiety within the molecular structure, a p-ethenylbenzyl group or m-ethenylbenzyl group on a molecular end thereof and a number-average molecular weight of from 1,000 to 7,000, and which also includes a crosslinkable curing agent.

In the polyphenylene ether resin composition described in Patent Literature 1, the PPE is three-dimensionally crosslinked; even in cases where a low-molecular-weight PPE is used to increase the flowability of the PPE resin composition, the composition includes a crosslinking agent so as to retain properties such as heat resistance. Triallyl isocyanurate (also referred to below as "TAIC") is used as this crosslinking agent.

However, the TAIC serving as this crosslinking agent has a reactivity contributing to the curing reaction which is somewhat low, and so a relatively large amount of reaction initiator must be added. This is because, when TAIC is included, with the addition of too little reaction initiator, the reaction slows and the glass transition point (Tg) does not easily rise. However, adding a bit too much reaction initiator may worsen the life of the varnish or prepreg obtained from the resin composition.

Moreover, with requirements for various properties in the insulating layers of recent printed wiring boards, etc. now more exacting than ever, there exists today a desire for substrate materials which, while retaining excellent dielectric (electrical) properties, are also endowed at even higher levels with such properties as heat resistance, adhesion and Tg.

CITATION LIST

Patent Literature

Patent Literature 1: Japanese Patent Application Publication (Translation of PCT Application) No. 2006-516297

SUMMARY OF INVENTION

In light of such circumstances, the object of this invention is to provide a polyphenylene ether resin composition which, while retaining the excellent dielectric properties of cured resin compositions such as have hitherto been obtained, is also endowed with excellent properties such as heat resistance, adhesion and Tg. Further objects of the invention are to provide a prepreg which uses such a polyphenylene ether resin composition, a metal-clad laminate which uses such a prepreg, and a printed wiring board produced using such a prepreg.

The polyphenylene ether resin composition according to one aspect of the invention is characterized by including (A) a modified polyphenylene ether that is end-modified with a substituent having a carbon-carbon unsaturated double bond, and (B) a crosslinking agent having a carbon-carbon unsaturated double bond. The crosslinking agent serving as component (B) includes from 50 to 100 mass % of (B-1) divinylbenzene and (B-2) polybutadiene. Components (A) and (B) are included in a ratio therebetween, expressed as the mass ratio (A):(B), of from 65:35 to 95:5. Components (B-1) and (B-2) are included in a ratio therebetween, expressed as the mass ratio (B-1):(B-2), of from 1:100 to 1.5:1.

The prepreg according to a further aspect of the invention is produced by impregnating a base with the polyphenylene ether resin composition.

The metal-clad laminate according to a still further aspect of the invention is produced by laminating the prepreg and metal foil by molding under applied heat and pressure.

The printed wiring board according to yet another aspect of the invention is a printed wiring board produced using the prepreg.

DESCRIPTION OF EMBODIMENTS

The polyphenylene ether resin composition according to the first aspect of the invention is characterized by including (A) a modified polyphenylene ether that is end-modified with a substituent having a carbon-carbon unsaturated double bond, and (B) a crosslinking agent having a carbon-carbon unsaturated double bond. The crosslinking agent serving as component (B) includes from 50 to 100 mass % of (B-1) divinylbenzene and (B-2) polybutadiene. Components (A) and (B) are included in a ratio therebetween, expressed as the mass ratio (A):(B), of from 65:35 to 95:5.

Components (B-1) and (B-2) are included in a ratio therebetween, expressed as the mass ratio (B-1):(B-2), of from 1:100 to 1.5:1.

Such a polyphenylene ether resin composition has, in the cured form thereof, an excellent balance of properties, such as a high Tg, adhesion and heat resistance, and moreover has excellent dielectric properties.

The ingredients in the polyphenylene ether resin composition according to this embodiment are described in detail below.

The modified polyphenylene ether used in this embodiment is not particularly limited, provided it is a modified polyphenylene ether that is end-modified with a substituent having a carbon-carbon unsaturated double bond.

The substituent having a carbon-carbon unsaturated double bond, although not particularly limited, is exemplified by substituents of Formula 1 below

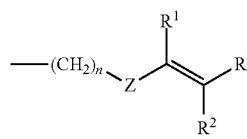

Formula 1

(where n is an integer from 0 to 10, Z is an arylene group, and $R^1$ to $R^3$ are each independently a hydrogen atom or an alkyl group).

Here, when n=0 in Formula 1, this indicates that Z is directly bonded to the end of the polyphenylene ether. The arylene group represented by Z is exemplified by monocyclic aromatic groups such as a phenylene group and polycyclic aromatic groups such as a naphthalene ring. Also included are derivatives in which hydrogen atoms bonded to the aromatic ring are substituted with functional groups such as alkenyl groups, alkynyl groups, formyl groups, alkylcarbonyl groups, alkenylcarbonyl groups or alkynylcarbonyl groups.

Preferred examples of the functional groups shown in Formula 1 include vinylbenzyl group-containing functional groups, illustrative examples of which include at least one substituent selected from Formula 2 and Formula 3 below.

[C2]

Formula 2

[C3]

Formula 3

Other substituents having a carbon-carbon unsaturated double bond with which the modified polyphenylene ether used in this embodiment may be end-modified include (meth)acrylate groups such as those of Formula 4 below

[C4]

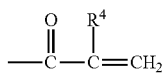

Formula 4

(wherein $R^4$ is a hydrogen atom or an alkyl group).

The modified polyphenylene ether (A) used in this embodiment has a number-average molecular weight which, although not particularly limited, is preferably from 1,000 to 7,000, more preferably from 1,000 to 5,000, and even more preferably from 1,000 to 3,000. Here, the number-average molecular weight should be one measured by a common molecular weight measurement method, such as the value measured by gel permeation chromatography (GPC).

When the modified polyphenylene ether has a number-average molecular weight within this range, it is thought that a resin composition can be obtained which more reliably possesses the excellent dielectric properties of polyphenylene ether, and the cured form of which more reliably has an excellent balance of high Tg, adhesion and heat resistance.

The modified polyphenylene ether used in this embodiment has an average number of carbon-carbon unsaturated double bond-containing substituents at molecular ends thereof (number of terminal substituents), per molecule of modified polyphenylene ether, of preferably from 1.5 to 3, more preferably from 1.7 to 2.7, and even more preferably from 1.8 to 2.5. When the number of substituents is too low, crosslink points may not readily form, as a result of which there is a tendency for a cured product of sufficient heat resistance to be difficult to obtain. On the other hand, when the number of substituents is too high, the reactivity may rise excessively, as a result of which undesirable effects may occur, such as a decrease in the storage stability of the polyphenylene ether resin composition or a decline in the flow properties of the polyphenylene ether resin composition.

The number of terminal substituents on the modified polyphenylene ether is, for example, a value representing the average number of substituents per molecule for all the modified polyphenylene ether present in one mole of the modified polyphenylene ether. This number of terminal substituents can be determined by measuring the number of hydroxyl groups remaining on the modified polyphenylene ether that has been obtained, and calculating the amount of decrease from the number of hydroxyl groups on the polyphenylene ether prior to modification. This amount of decrease from the number of hydroxyl groups on the polyphenylene ether prior to modification is the number of terminal functional groups. The number of hydroxyl groups remaining on the modified polyphenylene ether can be determined by adding, to a solution of the modified polyphenylene ether, a quaternary ammonium salt (tetraethylammonium hydroxide) that associates with hydroxyl groups, and measuring the UV absorbance of the resulting mixed solution.

The modified polyphenylene ether used in this embodiment has an intrinsic viscosity of preferably from 0.03 to 0.12 dL/g, more preferably from 0.04 to 0.11 dL/g, and even more preferably from 0.06 to 0.095 dL/g. When the intrinsic viscosity is too low, the molecular weight tends to be low, and there is a tendency for low dielectric properties such as a low dielectric constant and a low loss tangent to be difficult to obtain. On the other hand, when the intrinsic viscosity is too high, the viscosity is high and sufficient flowability cannot be obtained, as a result of which there is a tendency for the moldability of the cured product to decrease. Therefore, by having the intrinsic viscosity of the modified polyphenylene ether fall within the above range, excellent properties such as heat resistance and adhesion can be achieved in the cured product.

The intrinsic viscosity used here is the intrinsic viscosity measured in 25° C. methylene chloride. More specifically, it is the value obtained by measuring, for example, a 0.18 g/45 mL methylene chloride solution (solution temperature, 25° C.) with a viscometer. An example of this viscometer is the AVS500 Visco System, available from Schott Instruments GmbH.

In the modified polyphenylene ether used in this embodiment, it is desirable for the content of high-molecular-weight component having a molecular weight of 13,000 or more to be 5 mass % or less. That is, it is preferable for the modified polyphenylene ether of this embodiment to have a relatively narrow molecular weight distribution. It is especially preferable, in the modified polyphenylene ether of this embodiment, for the content of high-molecular-weight component having a molecular weight of 13,000 or more to be low; even modified polyphenylene ether containing no such high-molecular-weight component is acceptable, the lower limit in the range in the content of high-molecular-weight component having a molecular weight of 13,000 or more being 0 mass %. The content of high-molecular-weight component having a molecular weight of 13,000 or more in the modified polyphenylene ether may be from 0 to 5 mass %, and is more preferably from 0 to 3 mass %. In a modified polyphenylene ether having a narrow molecular weight distribution and a low content of high-molecular-weight component such as this, the reactivity contributing to the curing reaction is higher, and so a composition with better flowability tends to be obtained.

The content of the high-molecular-weight component can be determined by, for example, measuring the molecular weight distribution using gel permeation chromatography (GPC) and calculating the content based on the molecular weight distribution thus measured. Specifically, the content can be calculated from the peak surface area ratio based on the curve showing the molecular weight distribution obtained by GPC.

The modified polyphenylene ether according to this embodiment has a polyphenylene ether chain within the molecule. For example, it preferably has recurring units of Formula 5 below within the molecule.

[C5]

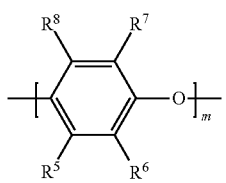

Formula 5

In Formula 5, m is from 1 to 50, and $R^5$, $R^6$, $R^7$ and $R^8$ are each independent. That is, $R^5$, $R^6$, $R^7$ and $R^8$ may each be the same group or different groups. $R^5$, $R^6$, $R^7$ and $R^8$ represent hydrogen atoms, alkyl groups, alkenyl groups, alkynyl groups, formyl groups, alkylcarbonyl groups, alkenylcarbonyl groups or alkynylcarbonyl groups. Of these, hydrogen atoms and alkyl groups are preferred.

The functional groups mentioned above for $R^5$, $R^6$, $R^7$ and $R^8$ are exemplified as follows.

The alkyl groups are not particularly limited, with alkyl groups of 1 to 18 carbons being preferred, and alkyl groups of 1 to 10 carbons being more preferred. Specific examples include methyl, ethyl, propyl, hexyl and decyl groups.

The alkenyl groups are not particularly limited, with alkenyl groups of 2 to 18 carbons being preferred, and alkenyl groups of 2 to 10 carbons being more preferred. Specific examples include vinyl, allyl, and 3-butenyl groups.

The alkynyl groups are not particularly limited, with alkynyl groups of 2 to 18 carbons being preferred, and alkynyl groups of 2 to 10 carbons being more preferred. Specific examples include ethynyl and prop-2-yn-1-yl groups (propargyl groups).

The alkylcarbonyl groups are not particularly limited so long as they are carbonyl groups substituted with an alkyl group, with alkylcarbonyl groups of 2 to 18 carbons being preferred, and alkylcarbonyl group of 2 to 10 carbons being more preferred. Illustrative examples include acetyl, propionyl, butyryl, isobutyryl, pivaloyl, hexanoyl, octanoyl and cyclohexylcarbonyl groups.

The alkenylcarbonyl groups are not particularly limited so long as they are carbonyl groups substituted with an alkenyl group, with alkenylcarbonyl groups of 3 to 18 carbons being preferred, and alkenylcarbonyl groups of 3 to 10 carbons being more preferred. Illustrative examples include acryloyl, methacryloyl and crotonoyl groups.

The alkynylcarbonyl groups are not particularly limited so long as they are carbonyl groups substituted with an alkynyl group, with alkynylcarbonyl groups of 3 to 18 carbons being preferred, and alkynylcarbonyl groups of 3 to 10 carbons being more preferred. An illustrative example is the propioloyl group.

When the modified polyphenylene ether has recurring units of Formula 5 in the molecule, m is preferably a numerical value such that the number-average molecular weight of the modified polyphenylene ether falls within the above-mentioned range. Specifically, this is preferably from 1 to 50.

The method of synthesizing the modified polyphenylene ether (A) used in this embodiment is not particularly limited, provided that a modified polyphenylene ether which has been end-modified by a substituent having a carbon-carbon unsaturated double bond can be synthesized. A specific example is a method wherein a polyphenylene ether in which a hydrogen atom on a terminal phenolic hydroxyl group has been substituted with an alkali metal atom such as sodium or potassium is reacted with a compound of Formula 6 below.

[C6]

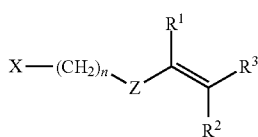

Formula 6

In Formula 6, as in Formula 1, n is an integer from 0 to 10, Z is an arylene group, and $R^1$ to $R^3$ are each independently a hydrogen atom or an alkyl group. Also, X is a halogen atom, specific examples of which include chlorine, bromine, iodine and fluorine atoms. Of these, a chlorine atom is preferred.

The compound of Formula 6 is not particularly limited. Preferred examples include p-chloromethylstyrene and m-chloromethylstyrene.

The compound of Formula 6 may be one of the above used singly or two or more used in combination.

The polyphenylene ether serving as a starting material is not particularly limited, provided a specific modified polyphenylene ether can ultimately be synthesized. Specific examples include those composed primarily of a polyarylene ether copolymer made up of 2,6-dimethylphenol and at least a difunctional phenol or a trifunctional phenol, or of a polyphenylene ether such as poly(2,6-dimethyl-1,4-phenylene oxide). Such polyphenylene ethers are exemplified by, for specifically, polyphenylene ethers having the structure shown in Formula 7.

[C7]

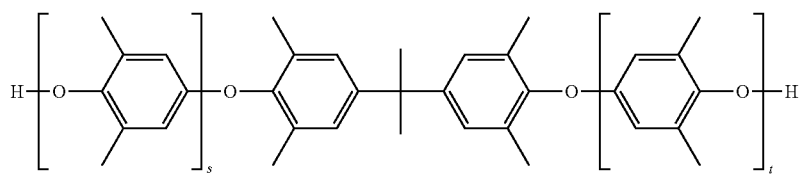

Formula 7

In Formula 7, s and t are preferably values such that the sum of s and t is from 1 to 30. Also, s is preferably from 0 to 20, and t is preferably from 0 to 20. That is, it is preferable for s to be from 0 to 20, for t to be from 0 to 20, and for the sum of s and t to be from 1 to 30.

The method of synthesizing the modified polyphenylene ether is exemplified by the method described above. Specifically, a polyphenylene ether like any of those mentioned above and a compound of Formula 6 are dissolved in a solvent and stirred, causing the polyphenylene ether and the compound of Formula 6 to react and thereby giving the modified polyphenylene ether used in this embodiment.

It is preferable to carry out this reaction in the presence of an alkali metal hydroxide. The reaction is thought to proceed favorably in this way.

The alkali metal hydroxide is not particularly limited, so long as it is one capable of acting as a dehalogenating agent. An illustrative example is sodium hydroxide. The alkali metal hydroxide is generally used in an aqueous solution state. Specifically, use can be made of an aqueous solution of sodium hydroxide.

Reaction conditions such as the reaction time and reaction temperature differ according to, for example, the compound of Formula 6, but are not particularly limited provided they are conditions under which the above reaction proceeds favorably. Specifically, the reaction temperature is preferably from room temperature to 100° C., and more preferably from 30 to 100° C. The reaction time is preferably from 0.5 to 20 hours, and more preferably from 0.5 to 10 hours.

The solvent used during the reaction is not particularly limited, provided it can dissolve the polyphenylene ether and the compound of Formula 6 and does not hinder the reaction between the polyphenylene ether and the compound of Formula 6. An illustrative example of the solvent is toluene.

This reaction is preferably carried out in the presence not only of an alkali metal hydroxide, but also of a phase transfer catalyst. That is, the reaction is preferably effected in the presence of an alkali metal hydroxide and a phase transfer catalyst. The reaction is thought to proceed more favorably in this way.

The phase transfer catalyst, although not particularly limited, is exemplified by quaternary ammonium salts such as tetra-n-butylammonium bromide.

The polyphenylene ether resin composition according to this embodiment preferably includes, as the modified polyphenylene ether, a modified polyphenylene ether obtained as described above.

Next, (B) the cross-linking agent having a carbon-carbon unsaturated double bond that is used in this embodiment is described.

The crosslinking agent having a carbon-carbon unsaturated double bond (B) of this embodiment includes from 50 to 100 mass % of (B-1) divinylbenzene and (B-2) polybutadiene.

First, the divinylbenzene (B-1) used in this embodiment may be, for example, a commercially available product, with the use of a high-purity divinylbenzene being preferred from the standpoint of improving Tg and reactivity. Specifically, the use of divinylbenzene having a purity of 60% or more is preferred, and the use of divinylbenzene having a purity of 80% or more is more preferred.

The polybutadiene (B-2) used in this embodiment, although not particularly limited, is exemplified by 1,4-polybutadiene, 1,2-polybutadiene, terminal acrylate-modified polybutadiene and terminal urethane methacrylate-modified polybutadiene. Of these, the use of polybutadiene having a number-average molecular weight of about 100 to about 4,000 is preferred, with a number-average molecular weight of from 500 to 3,000 being more preferred. Because polybutadiene having a number-average molecular weight in the above range has an excellent compatibility with polyphenylene ether, improved adhesion and heat resistance can be expected.

The polyphenylene ether resin composition according to this embodiment includes above components (A) and (B) in a ratio therebetween, expressed as the mass ratio (A):(B), of from 65:35 to 95:5. Moreover, the composition includes above components (B-1) and (B-2) in a ratio therebetween, expressed as the mass ratio (B-1):(B-2), of from 1:100 to 1.5:1. By having the polyphenylene ether resin composition include the components in these ratios, the composition can be obtained in a cured form which has a good balance of the properties required in printed wiring boards or the like, such as a high Tg, adhesion and heat resistance, and which moreover has excellent dielectric properties. These components are included in ratios which are more preferably (A):(B)=75:25 to 90:10, and (B-1):(B-2)=1:20 to 1.2:1.

The proportions in which these respective components are included, based on the combined amount of components (A)

and (B) in the cured form, are preferably from 65 to 95 mass % of the modified polyphenylene ether (A), from 0.1 to 15 mass % of the divinylbenzene (B-1), and from 4 to 25 mass % of the polybutadiene (B-2).

In this embodiment, the ratios in which the components are included refers not to the proportions in which the components are compounded during preparation of the resin composition nor to the component proportions in the varnish state, but to the component proportions in the so-called B-stage state in which the resin composition is semi-cured.

The ratios in which the components are included in the B-stage state can be measured by a combination of, for example, NMR, GC-MS and DI-MS.

The polyphenylene ether resin composition according to this embodiment may be composed of the modified polyphenylene ether (A), the divinylbenzene (B-1) and the polybutadiene (B-2), or may include other ingredients as long as these essential ingredients are included.

The polyphenylene ether resin composition of this embodiment preferably includes also, as a crosslinking agent (B): another crosslinking agent (B-3) having a carbon-carbon unsaturated double bond. In this case, the other crosslinking agent (B-3) is used in an amount within the crosslinking agent (B) of preferably 40 mass % or less, and at most 50 mass % or less. Improvements in adhesion and glass transition point (Tg) can be expected with the addition of another crosslinking agent (B-3), but the use of too much may lead to a decrease in the dielectric properties.

This additional crosslinking agent is not particularly limited, provided it is a carbon-carbon unsaturated double bond-containing crosslinking agent other than the divinylbenzene (B-1) and the polybutadiene (B-2) described above. The use of a crosslinking agent having a (meth)acrylate group is preferred. When a (meth)acrylate group-containing crosslinking agent is used, an improvement in adhesion (bonding strength) can be expected. With a polyfunctional crosslinking agent having a plurality of (meth)acrylate groups, an improvement in the glass transition point (Tg) can be expected.

Specific examples of (meth)acrylate group-containing crosslinking agents include alkyl (meth)acrylates, tricyclodecanol (meth)acrylates, fluorene (meth)acrylates, isocyanurate (meth)acrylates and trimethylolpropane (meth)acrylate.

When another crosslinking agent (B-3) is included, it is preferable to include, based on the combined amount of components (A) and (B) in the cured product, from 65 to 95 mass % of the modified polyphenylene ether (A), from 0.1 to 15 mass % of the divinylbenzene (B-1), from 4 to 25 mass % of the polybutadiene (B-2), and 17.5 mass % or less of the other crosslinking agent (B-3).

Aside from the crosslinking agent, examples of other ingredients include flame retardants, inorganic fillers, additives and reaction initiators. Even when other ingredients are included, the combined content of components (A) and (B), based on the overall polyphenylene ether resin composition, is preferably 30 mass % or more, more preferably from 30 to 90 mass %, and even more preferably from 40 to 80 mass %. Within this range, the advantageous effects generated by the polyphenylene ether resin composition are not hindered by the other ingredients and so can be fully manifested.

The polyphenylene ether resin composition of this embodiment preferably includes a flame retardant. The flame retardancy of the cured form of the polyphenylene ether resin composition can be further increased in this way. The flame retardant is not particularly limited, and is exemplified by halogen-based flame retardants such as bromine-based flame retardants and phosphorus-based flame retardants. Specific examples of halogen-based flame retardants include bromine-based flame retardants such as pentabromodiphenyl ether, octabromodiphenyl ether, decabromodiphenyl ether, tetrabromobisphenol A and hexabromocyclododecane; and chlorine-based flame retardants such as chlorinated paraffins. Examples of phosphorus-based flame retardants include phosphate esters such as condensed phosphate esters and cyclic phosphate esters; phosphazene compounds such as cyclic phosphazene compounds; phosphinate-type flame retardants such as metal salts of phosphinic acid, including aluminum dialkylphosphinates; and melamine-type flame retardants such as melamine phosphates and melamine polyphosphates. These flame retardants may be used singly, or two or more may be used in combination.

Of these, in order to elicit a sufficient flame-retarding effect when used in a small amount and cause substantially no decrease in Tg, the use of a non-compatible bromine-based compound as the bromine-containing flame retardant is preferred.

When a bromine-containing compound is used as the flame retardant, it is preferable that the bromine-containing compound is added in such manner that the bromine content based on the total amount of resin ingredients in the polyphenylene ether resin composition according to this embodiment is from 8 to 20 mass %. By the content in this way, a good flame retardancy is elicited without adversely affecting the heat resistance and flowability.

Inorganic fillers that may be included in the polyphenylene ether resin composition of this embodiment are exemplified by those added for the purpose of increasing the heat resistance and flame retardance of the cured form of the resin composition, and are not particularly limited. By including an inorganic filler, properties such as the heat resistance and flame retardance can be increased. Moreover, the polyphenylene ether-containing resin composition, when compared with, for example, epoxy resin compositions ordinary insulating bases, have a low crosslink density and cured products thereof have a high thermal expansion coefficient; in particular, the thermal expansion coefficient $\alpha 2$ at temperatures in excess of the Tg tends to be high. By including an inorganic filler, it is possible to achieve excellent dielectric properties, and also excellent heat resistance and flame retardance in cured products, to keep the viscosity when the composition is rendered into a varnish low, to reduce the thermal expansion coefficient of the cured form, particularly the thermal expansion coefficient $\alpha 2$ at temperatures in excess of the glass transition temperature, and to increase the toughness of cured product. Illustrative examples of inorganic fillers include silica, alumina, talc, aluminum hydroxide, magnesium hydroxide, titanium oxide, mica, aluminum borate, barium sulfate and calcium carbonate. The inorganic filler may be used directly as is, although one that has been surface-treated with a vinylsilane-type, styrylsilane-type, methacrylsilane-type or acrylsilane-type silane coupling agent is especially preferred. Metal-clad laminates obtained using a resin composition formulated with an inorganic filler that has been surface-treated with such a silane coupling agent tend to have a high heat resistance at the time of moisture absorption, and also tend to have a high interlayer peel strength.

When an inorganic filler is included, the content thereof, based on the polyphenylene ether resin composition, is preferably from 10 to 150 mass %, more preferably from 10 to 100 mass %, and even more preferably from 20 to 100 mass %.

As mentioned above, other additives may be included in the polyphenylene ether resin composition according to this embodiment. Examples of such additives include foam inhibitors such as silicone-type foam inhibitors and acrylate-type foam inhibitors, heat stabilizers, antistatic agents, ultraviolet absorbers, dyes and pigments, lubricants, and dispersants such as wetting and dispersing agents.

As mentioned above, the polyphenylene ether resin composition according to this embodiment may also include a reaction initiator. Even when the polyphenylene ether resin composition is composed of a modified polyphenylene ether and a heat-curing-type curing agent, the curing reaction is able to proceed at an elevated temperature. However, because there are cases where, depending on the process conditions, setting the temperature to a high temperature until curing proceeds would pose problems, a reaction initiator may be added. The reaction initiator is not particularly limited, so long as it is able to promote the curing reaction between the modified polyphenylene ether and the heat-curing type curing agent. Illustrative examples include the following oxidizing agents: α,α'-bis(t-butylperoxy-m-isopropyl)benzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxy isopropyl monocarbonate and azobisisobutyronitrile. If necessary, a carboxylic acid metal salt may be used together. The curing reaction can be further promoted in this way. Of these, the use of α,α'-bis(t-butylperoxy-m-isopropyl)benzene is preferred. Because α,α'-bis(t-butylperoxy-m-isopropyl)benzene has a relatively high reaction initiation temperature, the curing reaction can be suppressed at times where curing is not required, such as during drying of the prepreg, thus making it possible to suppress a decline in the storage stability of the polyphenylene ether resin composition. In addition, because α,α'-bis(t-butylperoxy-m-isopropyl)benzene has a low volatility, it does not volatilize during prepreg drying and storage, and thus has a good stability. The reaction initiator may be used singly, or two or more may be used in combination.

When producing a prepreg, it is common for the polyphenylene ether resin composition of this embodiment to be prepared and used in the form of a varnish for the purpose of impregnating a base (fibrous base) to form the prepreg. Hence, it is common for the polyphenylene ether resin composition to have been formed into a varnish (resin varnish). Such a resin varnish may be prepared in, for example, the following manner.

First, the various ingredients that can dissolve in an organic solvent, such as the modified polyphenylene ether and the heat-curing type curing agent, are poured into an organic solvent and dissolved. If necessary, heating may be carried out at this time. Then, ingredients which are optionally used and do not dissolve in the organic solvent, such as inorganic fillers, are added and, using a ball mill, bead mill, planetary mixer, roll mill or the like, are dispersed until they reach a given dispersed state, thereby preparing a varnish-type resin composition. Organic solvents that may be used here are not particularly limited, provided they dissolve the modified polyphenylene ether, the heat-curing type curing agent and the like, and do not hinder the curing reaction. A specific example is toluene.

When this varnish is rendered into a cured product (prepreg) by way of a drying under heating step as subsequently described, because the divinylbenzene included in the polyphenylene ether resin composition according to this embodiment volatilizes, the compounded amounts of the ingredients in the varnish differ from the ratios in which they are included in the resulting prepreg. Therefore, it is essential for the compounded amounts of the various ingredients in the varnish to be adjusted in such a way that the ratios in which these ingredients are included in the resulting B-stage semi-cured product (prepreg) fall within the above-indicated ranges. For example, one might determine beforehand the amount of divinylbenzene that volatilizes off in the course of the drying under heating step that converts the resin composition into the B-stage product, then calculate the ratios in which the respective ingredients must be included in the resin composition for the desired amounts to be achieved at the B-stage state, and set the amounts in which these ingredients are compounded in the varnish preparation stage accordingly.

Specifically, about 80% of the divinylbenzene volatilizes off in the course of a commonly carried out step for rendering a varnish-type resin composition into a prepreg (drying under heating step), such as a step in which, following immersion in a base having a thickness of 0.1 mm, drying is carried out under heating at 130° C. for 3 minutes. Therefore, in cases that involve passing through such a drying under heating step, it is preferable to adjust the varnish formulation by adding divinylbenzene so that this is included in a ratio about 5 times the ratio in the B-stage state.

An example of a method for producing prepregs using the resulting resin varnish is one in which a fibrous base is impregnated with the resin varnish, then dried.

Illustrative examples of fibrous bases that may be used in the production of prepregs include glass cloth, aramid cloth, polyester cloth, glass nonwoven fabric, aramid nonwoven fabric, polyester nonwoven fabric, wood pulp-based paper and cotton linter paper. By using glass cloth, a laminate having an excellent mechanical strength is obtained; glass cloth that has been subjected to flattening treatment is especially preferred. Flattening treatment may be carried out by, for example, continuously applying a suitable pressure to the glass cloth with a roller press so as to flatten and compress the yarn. Use can generally be made of a fibrous base having a thickness of, for example, from 0.04 to 0.3 mm.

Impregnation of the fibrous base with the resin varnish is carried out by dipping, coating or the like. If necessary, such impregnation may be repeated a plurality of times. When doing so, it is also possible to repeat impregnation using a plurality of resin varnishes having different compositions or concentrations and thereby ultimately adjust the composition and amount of resin as desired.

The resin varnish-impregnated fibrous base is heated under the desired heating conditions, such as at 80 to 170° C. for 1 to 10 minutes, so as to remove the solvent, thereby giving a prepreg in a semi-cured state (B-stage).

The method of producing a metal-clad laminate using the prepreg thus obtained may entail using a single prepreg or stacking together a plurality of such prepregs, then placing a metal foil such as copper foil, either on both the top and bottom sides or on only one side of the single prepreg or prepreg stack, and integrally laminating the resulting assembly by molding under applied heat and pressure so as to produce a laminate clad on one or both sides with metal foil. The heating and pressing conditions may be suitably set according to such factors as the thickness of the laminate to be produced and the type of prepreg resin composition. For example, the temperature may be set to from 170 to 210° C., the pressure may be set to from 1.5 to 4.0 MPa, and the time may be set to from 60 to 150 minutes.

The polyphenylene ether resin composition according to this embodiment is a polyphenylene ether resin composition having an excellent balance of properties, including dielectric properties and high Tg, adhesion and heat resistance. As a result, metal-clad laminates obtained with prepregs formed using the polyphenylene ether resin composition can be used to produce printed wiring boards which have excellent dielectric properties and heat resistance, a high Tg, and which suppress the occurrence of molding defects.

Moreover, by etching or otherwise processing the metal foil at the surface of the laminate thus produced so as to form a circuit, it is possible to obtain a printed wiring board having a conductor pattern provided as a circuit on the surface of the laminate.

The major features of the art disclosed in this Specification are summarized below.

The polyphenylene ether resin composition according to one aspect of the invention is characterized by including (A) a modified polyphenylene ether that is end-modified with a substituent having a carbon-carbon unsaturated double bond, and (B) a crosslinking agent having a carbon-carbon unsaturated double bond. The crosslinking agent serving as component (B) includes from 50 to 100 mass % of (B-1) divinylbenzene and (B-2) polybutadiene. Components (A) and (B) are included in a ratio therebetween, expressed as the mass ratio (A):(B), of from 65:35 to 95:5. Components (B-1) and (B-2) are included in a ratio therebetween, expressed as the mass ratio (B-1):(B-2), of from 1:100 to 1.5:1.

Such a polyphenylene ether resin composition has, in the cured form thereof, an excellent balance of properties such as high Tg, adhesion and heat resistance, and moreover has excellent dielectric properties.

The polyphenylene ether resin composition of the invention preferably includes, based on the combined amount of components (A) and (B): 70 to 95 mass % of the modified polyphenylene ether (A), 0.1 to 15 mass % of the divinylbenzene (B-1), and 4 to 25 mass % of the polybutadiene (B-2). This is thought to enable an excellent polyphenylene ether resin composition like that described above to be more reliably obtained.

In the polyphenylene ether resin composition of the invention, the crosslinking agent serving as component (B) may further include 50 mass % or less of (B3) another crosslinking agent having a carbon-carbon unsaturated double bond.

This other crosslinking agent (B-3) preferably includes a (meth)acrylate group-containing compound. The adhesion (bonding strength) of the cured form of the resin composition can be enhanced in this way.

In addition, it is preferable for the inventive polyphenylene ether resin composition to include, based on the combined amount of components (A) and (B): 70 to 95 mass % of the modified polyphenylene ether (A), 0.1 to 15 mass % of the divinylbenzene (B-1), 4 to 25 mass % of the polybutadiene (B-2), and 17.5 mass % or less of the other crosslinking agent (B-3). This is thought to enable an excellent polyphenylene ether resin composition like that described above to be more reliably obtained.

In addition, the substituent at the end of the modified polyphenylene ether (A) is preferably a substituent of Formula 1 below

[C8]

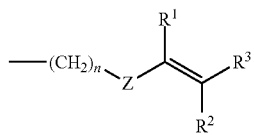

Formula 1

(wherein n is an integer from 0 to 10, Z is an arylene group, and $R^1$ to $R^3$ are each independently a hydrogen atom or an alkyl group). This is thought to enable a polyphenylene ether resin composition endowed with a low dielectric constant, low loss tangent and an even better reactivity to be obtained.

Also, the substituent at the end of the modified polyphenylene ether (A) is preferably a substituent selected from Formula 2 and Formula 3 below.

[C9]

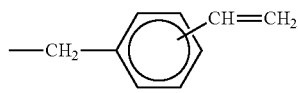

Formula 2

[C10]

Formula 3

This is thought to enable a resin composition which, while retaining excellent dielectric properties, also has an excellent balance of heat resistance, flowability and reactivity to be reliably obtained.

Alternatively, it is preferable for the substituent at the end of the modified polyphenylene ether (A) to be a substituent having a (meth)acrylate group. In this way, advantageous effects similar to those obtained by modifying polyphenylene ether with functional groups of above Formulas 1 to 3 can be expected.

Also, in the polyphenylene ether resin composition of the invention, it is preferable for the modified polyphenylene ether (A) to have a number-average molecular weight of from 1,000 to 7,000. This should enable an excellent polyphenylene ether resin composition like that described above to be more reliably obtained.

The inventive polyphenylene ether resin composition preferably further includes a flame retardant. Flame retardancy can be more reliably imparted in this way.

Moreover, in this polyphenylene ether resin composition, it is preferable that the flame retardant is a bromine-containing compound and the bromine-containing compound is added in such manner that the bromine content based on the total amount of resin components in the resin composition is from 8 to 20 mass %. This has the advantage of exhibiting a good flame retardancy without adversely impacting on heat resistance and flowability.

The prepreg according to a further aspect of the invention is produced by impregnating a base with the above polyphenylene ether resin composition. The prepreg thus obtained has a high Tg and an excellent balance of, for example, dielectric properties, adhesion and heat resistance.

The metal-clad laminate according to a still further aspect of the invention is produced by laminating the above prepreg and metal foil by molding under applied heat and pressure.

The metal-clad laminate thus obtained has a high Tg and an excellent balance of dielectric properties, adhesion and heat resistance.

The printed wiring board according to yet another aspect of the invention is produced using the above prepreg. The printed wiring board thus obtained has a high Tg and an excellent balance of dielectric properties, adhesion and heat resistance.

The invention is illustrated more fully below by way of examples, although these examples do not limit the scope of the invention.

EXAMPLES

First, a modified polyphenylene ether was synthesized. The intrinsic viscosity as measured in 25° C. methylene chloride is indicated below as the "intrinsic viscosity (IV)." Also, the average number of phenolic hydroxyl groups at molecular ends per molecule of polyphenylene ether is indicated as the "number of terminal hydroxyl groups."

[Synthesis of Modified Polyphenylene Ether 1 (Modified PPE 1)]

Polyphenylene ether and chloromethylstyrene were reacted to give Modified Polyphenylene Ether 1 (Modified PPE 1). First, a 1-liter three-neck flask fitted with a temperature regulator, a stirrer, a cooling apparatus and a dropping funnel was charged with 200 g of polyphenylene ether (a polyphenylene ether having the structure shown in Formula 5 above: SA 90, available from SABIC's Innovative Plastics; intrinsic viscosity (IV), 0.083 dL/g; number of terminal hydroxyl groups, 1.9; number-average molecular weight Mn, 2,000), 30 g of a 50:50 by mass mixture of p-chloromethylstyrene and m-chloromethylstyrene (chloromethylstyrene (CMS) available from Tokyo Chemical Industry Co., Ltd.), 1.227 g of tetra-n-butylammonium bromide as the phase transfer catalyst and 400 g of toluene, and the flask contents were stirred. Stirring was carried out until the polyphenylene ether, the chloromethylstyrene and the tetra-n-butylammonium bromide dissolved in the toluene, during which time the flask contents were gradually heated to an ultimate liquid temperature of 75° C. To this solution was added dropwise, over a period of 20 minutes, an aqueous solution of sodium hydroxide (20 g sodium hydroxide/20 g water) as the alkali metal hydroxide. This was followed by 4 hours of stirring at 75° C. Next, the flask contents were neutralized with 10 mass % of hydrochloric acid, following which a large amount of methanol was poured in, causing a precipitate to form in the liquid within the flask. That is, the reaction product present in the reaction mixture within the flask was re-precipitated. This precipitate was collected by filtration, rinsed three times with a 80:20 by mass mixture of methanol and water, then dried under reduced pressure at 80° C. for 3 hours.

The solid thus obtained was analyzed by 1H-NMR spectroscopy (400 MHz, $CDCl_3$, TMS). As a result of NMR measurement, a peak attributable to ethenylbenzyl was confirmed at 5 to 7 ppm. Hence, it was possible to confirm that the solid obtained was a modified polyphenylene ether having groups of Formula 1 at the molecular ends. Specifically, this was confirmed to be an ethenylbenzylated polyphenylene ether.

The molecular weight distribution of the modified polyphenylene ether was measured by GPC. The number-average molecular weight (Mn) was calculated from the molecular weight distribution obtained, as a result of which the Mn was 2,300.

The number of terminal functional groups on the modified polyphenylene ether was measured as follows.

First, the modified polyphenylene ether was precisely weighed, the weight at this time being denoted as X (mg). This modified polyphenylene ether that had been weighed was dissolved in 25 mL of methylene chloride and to this solution was added 100 μL of an ethanol solution of 10 mass % of tetraethylammonium hydroxide (TEAH) (TEAH:ethanol (volume ratio)=15:85), following which the absorbance (Abs) at 318 nm was measured using a UV spectrophotometer (UV-1600, from Shimadzu Corporation). The number of terminal hydroxyl groups on the modified polyphenylene ether was then calculated from the measured results using the following formula.

$$\text{Amount of remaining OH (μmol/g)} = [(25 \times \text{Abs})/(\varepsilon \times OPL \times X)] \times 10^6$$

Here, ε represents the extinction coefficient, which is 4,700 L/mol·cm. OPL is the optical path length of the cell, which is 1 cm.

Next, given that this calculated amount of remaining OH (number of terminal hydroxyl groups) on the modified polyphenylene ether was substantially zero, it was apparent that substantially all the hydroxyl groups on the polyphenylene ether prior to modification had been modified. It was found from this fact that the amount of decrease from the number of terminal hydroxyl groups on the polyphenylene ether prior to modification was the number of terminal hydroxyl groups on the polyphenylene ether prior to modification. That is, the number of terminal hydroxyl groups on the polyphenylene ether prior to modification was found to be the number of terminal functional groups on the modified polyphenylene ether. The number of terminal functional groups was 1.9.

In addition, the intrinsic viscosity (IV) of the modified polyphenylene ether in 25° C. methylene chloride was measured. Specifically, the intrinsic viscosity (IV) of the modified polyphenylene ether was determined by measuring a 0.18 g/45 mL solution of the modified polyphenylene ether in methylene chloride (liquid temperature, 25° C.) with a viscometer (the AVS500 Visco System from Schott Instruments GmbH). As a result, the intrinsic viscosity (IV) of the modified polyphenylene ether was 0.086 dL/g.

The molecular weight distribution of the modified polyphenylene ether was measured by GPC. Next, the number-average molecular weight (Mn) and the content of the high-molecular-weight component having a molecular weight of 13,000 or more were calculated from the resulting molecular weight distribution. The content of the high-molecular-weight component was calculated from the ratio of the peak surface area based on the curve showing the molecular weight distribution obtained by GPC. As a result, Mn was 2,300 and the content of the high-molecular weight component was 0.1 mass %.

Examples 1 to 11, Comparative Examples 1 to 8

The ingredients used when preparing polyphenylene ether resin compositions in these examples are described.

(Polyphenylene Ethers)

Modified PPE 1: A modified polyphenylene ether obtained by the synthesis method described above.

Modified PPE 2: SA 9000, from SABIC's Innovative Plastics (a modified polyphenylene ether in which the terminal hydroxyl groups of the polyphenylene ether of Formula 7 have been modified with methacryl groups)

(Crosslinking Agents)

DVB 810: Divinylbenzene, approx. 81% purity (Nippon Steel & Sumikin Chemical Co. Ltd.)

B-1000: Polybutadiene (Nippon Soda Co., Ltd.)

DCP: Tricyclodecane dimethanol dimethacrylate (Shin-Nakamura Chemical Co., Ltd.; a monomer having a molecular weight of 332)

TAIC: Triallyl isocyanurate (Nihon Kasei Chemical Co., Ltd.)

(Reaction Initiator)

Initiator: 1,3-Bis(butylperoxy isopropyl)benzene (Perbutyl P, from NOF Corporation)

(Flame Retardant)

SAYTEX 8010: Ethylenebis(pentabromophenyl) (Albemarle Japan Corporation)

[Method of Preparation]

First, the ingredients other than the initiator were added to toluene in the proportions shown in Table 1 (in the table, "parts" refers to parts by mass) so as to give a solids concentration of 50 mass %, and mixed. The mixture was then heated to 80° C., and stirred for 30 minutes while at 80° C. Next, the stirred mixture was cooled to 40° C., following which the initiator 1,3-bis(butylperoxyisopropyl)benzene (Perbutyl P, from NOF Corporation) was added in the proportions shown in Table 1, thereby giving a varnish-type resin composition (resin varnish).

sured. This measured prepreg was additionally heated at 200° C. for 25 minutes, whereupon the weight loss after heating relative to before heating was zero. In a separate procedure, the volatilized ingredients in the resin composition within the prepreg were measured by GC-MS under 15 minutes of heating at 163° C., which are the same conditions as above; a trace amount of toluene was detected, but substantially the entire amount of volatilized ingredient was confirmed to be divinylbenzene. Therefore, the weight loss $\Delta M$ was found to correspond to the divinylbenzene that remained in the prepreg. If it is assumed here that divinylbenzene did not volatilize off in the course of the prepreg production process (drying under heating step), a hypothetical remaining amount M of divinylbenzene in the prepreg can be calculated from the compounding ratios of the various ingredients at the varnish stage. Hence, the amount of divinylbenzene that actually volatilized off in the course of the prepreg production process becomes M–$\Delta M$. For instance, in Example 1, as shown in Table 1, the compounded amount of divinylbenzene in the varnish stage was 15 parts by mass, but when $\Delta M$ was measured by the above method, this corresponded to 2.625 parts by mass. This means that the volatilized amount of divinylbenzene corresponds to 82.5% of the initial compounded amount. Also, the remaining amount of divinylbenzene in the prepreg was calculated based on the measured result for $\Delta M$ in each of

TABLE 1

|  |  | EX 1 | EX 2 | EX 3 | EX 4 | EX 5 | EX 6 | EX 7 | EX 8 | EX 9 | EX 10 | EX 11 |
|---|---|---|---|---|---|---|---|---|---|---|---|---|
| Modified PPE 1 | parts | 70 | 75 | 80 | 70 | 80 | 85 | 57 |  | 70 | 70 | 70 |
| Modified PPE 2 | parts |  |  |  |  |  |  |  | 71 |  |  |  |
| DVB 810 | parts | 15 | 15 | 15 | 20 | 10 | 5 | 7 | 13 | 15 | 15 | 15 |
| B-1000 | parts | 15 | 10 | 5 | 10 | 10 | 10 | 36 | 16 | 12 | 10 | 8 |
| TAIC | parts |  |  |  |  |  |  |  |  |  |  |  |
| DCP | parts |  |  |  |  |  |  |  |  | 3 | 5 | 7 |
| Perbutyl P | phr | 1 | 1 | 1 | 1 | 1 | 1 | 1 | 1 | 1 | 1 | 1 |
| SAYTEX 8010 | phr | 19 | 19 | 19 | 19 | 19 | 19 | 19 | 19 | 19 | 19 | 19 |

|  |  | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 |
|---|---|---|---|---|---|---|---|---|---|
| Modified PPE 1 | parts | 70 | 50 | 70 | 70 | 39 | 90 | 80 | 50 |
| Modified PPE 2 | parts |  |  |  |  |  |  |  |  |
| DVB 810 | parts | 30 | 25 | 15 |  | 56 |  |  | 25 |
| B-1000 | parts | 0 | 25 |  |  | 6 | 10 |  | 22 |
| TAIC | parts |  |  | 15 | 30 |  |  | 20 |  |
| DCP | parts |  |  |  |  |  |  |  | 3 |
| Perbutyl P | phr | 1 | 1 | 1 | 1 | 1 | 1 | 1 | 1 |
| SAYTEX 8010 | phr | 19 | 19 | 19 | 19 | 19 | 19 | 19 | 19 |

Next, glass cloth (#2116 type. WEA116E, E Glass, 0.1 mm thick; available from Nitto Boseki Co., Ltd.) is impregnated with the resulting resin varnish, then dried under heating at 130° C. for about 3 minutes, thereby giving a 100 μm thick prepreg. The combined content (resin content) of the resin components such as the polyphenylene ether and the thermal cross-linking type curing agent at this time was adjusted so as to be about 50 mass %.

The ratios in which the respective ingredients are included in the resulting B-stage state (prepreg) differ from the compounding ratios in the varnish on account of volatilization by some of the divinylbenzene due to the drying under heating step, and are as shown in Table 2 (in the table, "parts" refers to parts by mass). The ratios in which the various ingredients are included in the B-stage state were determined as follows. First, a prepreg obtained as described above was heated at 163° C. for 15 minutes, and the weight loss $\Delta M$ after heating relative to before heating was meathe examples of the invention and the comparative examples and, based on this, the numerical values re-computed in such a way that the combined amount of modified polyphenylene ether (modified PPE 1, modified PPE 2), divinylbenzene (DVB810) and polybutadiene (B-1000) becomes 100 parts by mass are presented in Table 2.

Next, six prepregs thus produced were stacked together and 18 μm thick copper foil (MLS-G, from Mitsui Mining & Smelting Co., Ltd.) was arranged on both sides of the stack, thereby giving an assembly to be pressed, and the copper foil was bonded to both sides by 100 minutes of applied heat and pressure under a temperature of 200° C. and a pressure of 3 MPa (megapascals), giving a copper-clad laminate having a thickness of 0.8 mm.

Tests were carried out by the following methods on the respective prepregs and test substrates thus produced.

[Dielectric Properties (Dielectric Constant and Loss Tangent)]

The dielectric constants and loss tangents of the test substrates at 10 GHz were measured by the cavity resonator perturbation method. Specifically, the dielectric constants and loss tangents of the test substrates at 10 GHz were measured using a network analyzer (N5230A, from Agilent Technologies).

atmosphere (0.2 MPa), 5-hour pressure cooker test (PCT) was carried out on each sample. Using a sample number of five, the samples were dipped for 20 seconds in a 288° C. solder bath and then visually examined for the occurrence of measling and swelling.

[Flame Retardance]

The copper-clad laminate was etched, then cut to a size of 127×12.7 mm, following which the flame retardance was evaluated in accordance with UL 94.

The results from the above tests are shown in Table 2.

TABLE 2

|  |  | EX 1 | EX 2 | EX 3 | EX 4 | EX 5 | EX 6 | EX 7 | EX 8 | EX 9 | EX 10 | EX 11 |
|---|---|---|---|---|---|---|---|---|---|---|---|---|
| Modified PPE 1 | parts | 80 | 85 | 90 | 82 | 87 | 89 | 80 |  | 78 | 78 | 78 |
| Modified PPE 2 | parts |  |  |  |  |  |  |  | 79 |  |  |  |
| DVB 810 | parts | 3 | 3 | 3 | 5 | 2 | 1 | 10 | 3 | 3 | 3 | 3 |
| B-1000 | parts | 17 | 12 | 7 | 13 | 11 | 10 | 10 | 18 | 13 | 11 | 8 |
| TAIC | parts |  |  |  |  |  |  |  |  |  |  |  |
| DCP | parts |  |  |  |  |  |  |  |  | 3 | 6 | 8 |
| Perbutyl P | phr | 1 | 1 | 1 | 1 | 1 | 1 | 1 | 1 | 1 | 1 | 1 |
| SAYTEX 8010 | phr | 21 | 21 | 21 | 22 | 20 | 20 | 27 | 21 | 21 | 21 | 21 |
| Loss tangent (Df) |  | 0.005 | 0.005 | 0.005 | 0.005 | 0.005 | 0.005 | 0.005 | 0.005 | 0.05 | 0.005 | 0.006 |
| Dielectric constant (Dk) |  | 3.6 | 3.6 | 3.7 | 3.6 | 3.6 | 3.6 | 3.6 | 3.6 | 3.6 | 3.6 | 3.6 |
| Copper Peel |  | 0.5 | 0.5 | 0.5 | 0.5 | 0.5 | 0.5 | 0.5 | 0.5 | 0.6 | 0.6 | 0.7 |
| Tg |  | 207 | 210 | 207 | 212 | 205 | 201 | 220 | 215 | 210 | 213 | 217 |
| PCT solder dip resistance |  | Good | Good | Good | Good | Good | Good | Good | Good | Good | Good | Good |
| Flame retardancy |  | V-0 | V-0 | V-0 | V-0 | V-0 | V-0 | V-0 | V-0 | V-0 | V-0 | V-0 |

|  |  | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 |
|---|---|---|---|---|---|---|---|---|---|
| Modified PPE 1 | parts | 91 | 63 | 79 | 70 | 70 | 90 | 80 | 60 |
| Modified PPE 2 | parts |  |  |  |  |  |  |  |  |
| DVB 810 | parts | 9 | 6 | 3 |  | 20 |  |  | 6 |
| B-1000 | parts |  | 31 |  |  | 10 | 10 |  | 26 |
| TAIC | parts |  |  | 18 | 30 |  |  | 20 |  |
| DCP | parts |  |  |  |  |  |  |  | 4 |
| Perbutyl P | phr | 1 | 1 | 1 | 1 | 1 | 1 | 1 | 1 |
| SAYTEX 8010 | phr | 24 | 23 | 21 | 19 | 34 | 19 | 19 | 23 |
| Loss tangent (Df) |  | 0.005 | 0.006 | 0.005 | 0.005 | 0.005 | 0.005 | 0.005 | 0.006 |
| Dielectric constant (Dk) |  | 3.7 | 3.5 | 3.7 | 3.7 | 3.6 | 3.6 | 3.7 | 3.5 |
| Copper Peel |  | 0.2 | 0.5 | 0.2 | 0.5 | 0.2 | 0.4 | 0.5 | 0.6 |
| Tg |  | 215 | 210 | 205 | 195 | 230 | 195 | 190 | 215 |
| PCT solder dip resistance |  | Good | NG | Good | Good | Good | Good | Good | NG |
| Flame retardancy |  | V-0 | V-1 | V-0 | V-0 | V-0 | V-0 | V-0 | V-1 |

[Copper Foil Bonding Strength]

The peel strength between the first and second sheets of glass cloth in the copper-clad laminate was measured in accordance with JIS C 6481. A pattern having a width of 10 mm and a length of 100 mm was formed, the copper foil was peeled off at a rate of 50 mm/min by a peel tester, and the peel strength at this time was measured. The measurement units were kN/m.

[Glass Transition Temperature (Tg)]

The Tg of each prepreg was measured using a DMS 100 dynamic mechanical spectrometer from Seiko Instruments. At this time, the frequency in the bending module was set to 10 Hz and dynamic mechanical analysis (DMA) was carried out. The temperature at which tan δ reaches a maximum when the temperature is raised at a rate of 5° C./min from room temperature to 280° C. was treated as Tg.

[PCT Solder Dip Resistance]

The solder dip resistance after moisture uptake was measured by the following method. First, the 50 mm×50 mm copper-clad laminate obtained was etched, and a 121° C., 2

As is apparent from Table 2, the examples (Examples 1 to 11) of the polyphenylene ether resin composition according to this invention have, in the cured forms thereof, a high Tg of 200° C. or more, an excellent balance of properties such as adhesion and heat resistance, and also excellent dielectric properties.

Moreover, in Examples 9 to 11, wherein a (meth)acrylate group-containing crosslinking agent was added as a third crosslinking agent, it is apparent that the copper foil bonding strength is larger than in the other examples and the adhesion is improved.

By contrast, in Comparative Examples 4 and 7, in which TAIC alone was used as the crosslinking agent, the Tg decreased. In Comparative Example 3, in which both TAIC and divinylbenzene were used together as the crosslinking agent, the Tg rose, but the adhesion decreased.

In Comparative Example 1, in which divinylbenzene alone was used as the crosslinking agent, the Tg rose, but the hard, brittle molecular skeleton increased, as a result of which adhesion was inadequate. Also, in Comparative Example 6 wherein divinylbenzene was not used as the crosslinking agent, with polybutadiene alone being used for this purpose, the Tg decreased and the adhesion was also somewhat inferior.

In Comparative Example 5, divinylbenzene and polybutadiene were used together as the crosslinking agent, but too much divinylbenzene was added relative to the polybutadiene. As a result, the adhesion decreased.

In Comparative Example 2, divinylbenzene and polybutadiene were used together as the crosslinking agent, but too much polybutadiene was added. As a result, the heat resistance and flame retardance decreased. The same tendency was observed as well in Comparative Example 8, in which a crosslinking agent containing (meth)acrylate groups was also added as part of the crosslinking agent.

This application is based on Japanese Patent Application No. 2013-127464 filed on Jun. 18, 2013, the entire contents of which are incorporated herein by reference.

Although the invention has been fully and appropriately described above by way of specific embodiments, it should be appreciated that various modifications and/or improvements thereto will be readily apparent to those skilled in the art. It is therefore to be understood that such modified or improved embodiments practiced by those skilled in the art, insofar as they do not depart from the scope of the claims as set forth herein, are encompassed within the scope of the claims.

INDUSTRIAL APPLICABILITY

This invention has wide industrial applicability in technical fields relating to, for example, resin compositions and printed wiring boards using the same.

The invention claimed is:

1. A polyphenylene ether resin composition comprising
(A) a modified polyphenylene ether that is end-modified with a substituent having a carbon-carbon unsaturated double bond, and
(B) a crosslinking agent having a carbon-carbon unsaturated double bond, wherein the crosslinking agent serving as component (B) includes from 50 to 100 mass % of (B-1) divinylbenzene and (B-2) polybutadiene,
components (A) and (B) are included in a ratio therebetween, expressed as the mass ratio (A) : (B), of from 65:35 to 95:5,
components (B-1) and (B-2) are included in a ratio therebetween, expressed as the mass ratio (B-1) : (B-2), of from 1:100 to 1.5:1, and
the (B-2) polybutadiene comprises at least one selected from the group consisting of 1,4-polybutadiene and 1,2-polybutadiene.

2. The polyphenylene ether resin composition according to claim 1, comprising, based on the combined amount of components (A) and (B):
70 to 95 mass % of the modified polyphenylene ether (A);
0.1 to 15 mass % of the divinylbenzene (B-1); and
4 to 25 mass % of the polybutadiene (B-2).

3. The polyphenylene ether resin composition according to claim 1, wherein the crosslinking agent serving as component (B) further includes 50 mass % or less of (B-3) another crosslinking agent having a carbon-carbon unsaturated double bond.

4. The polyphenylene ether resin composition according to claim 3, wherein the other crosslinking agent (B-3) includes a (meth)acrylate group-containing compound.

5. The polyphenylene ether resin composition according to claim 3, comprising, based on the combined amount of components (A) and (B):
70 to 95 mass % of the modified polyphenylene ether (A);
0.1 to 15 mass % of the divinylbenzene (B-1);
4 to 25 mass % of the polybutadiene (B-2); and
17.5 mass % or less of the other crosslinking agent (B-3).

6. The polyphenylene ether resin composition according to claim 1, wherein the substituent at the end of the modified polyphenylene ether (A) comprises a substituent of Formula 1 below

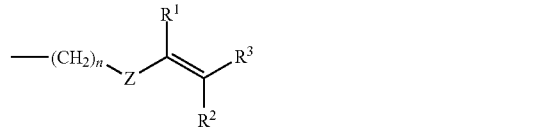

Formula 1 where n is an integer from 0 to 10, Z is an arylene group, and $R^1$ to $R^3$ are each independently a hydrogen atom or an alkyl group.

7. The polyphenylene ether resin composition according to claim 1, wherein the substituent at the end of the modified polyphenylene ether (A) comprises a substituent selected from Formula 2 or Formula 3 below

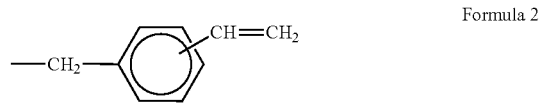

Formula 2

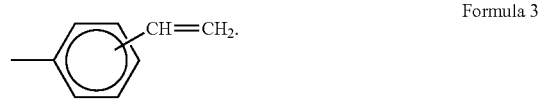

Formula 3

8. The polyphenylene ether resin composition according to claim 1, wherein the substituent at the end of the modified polyphenylene ether (A) comprises a substituent having a (meth)acrylate group.

9. The polyphenylene ether resin composition according to claim 1, wherein the modified polyphenylene ether (A) has a number-average molecular weight of from 1,000 to 7,000.

10. The polyphenylene ether resin composition according to claim 1, further comprising a flame retardant.

11. The polyphenylene ether resin composition according to claim 10, wherein the flame retardant is a bromine-containing compound and the bromine-containing compound is added in such manner that the bromine content based on the total amount of resin components in the resin composition is from 8 to 20 mass %.

12. A prepreg obtained by impregnating a base with the polyphenylene ether resin composition according to claim 1.

13. A metal-clad laminate produced by laminating the prepreg according to claim 12 and metal foil by molding under applied heat and pressure.

14. A printed wiring board produced using the prepreg according to claim 12.

* * * * *